US 6,358,848 B1

(12) United States Patent
Lopatin (10) Patent No.: US 6,358,848 B1
(45) Date of Patent: Mar. 19, 2002

(54) METHOD OF REDUCING ELECTROMIGRATION IN COPPER LINES BY FORMING AN INTERIM LAYER OF CALCIUM-DOPED COPPER SEED LAYER IN A CHEMICAL SOLUTION AND SEMICONDUCTOR DEVICE THEREBY FORMED

(75) Inventor: Sergey Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/728,685

(22) Filed: Nov. 30, 2000

(51) Int. Cl.$^7$ ....................... H01L 21/4763; H01L 21/44
(52) U.S. Cl. ....................... 438/687; 438/622; 438/625; 438/629; 438/660; 438/678
(58) Field of Search ................. 438/687, 660, 438/663, 667, 668, 674, 675, 678, 622, 620, 625, 626, 627, 628, 629, 631–633, 642, 652–654

(56) References Cited

U.S. PATENT DOCUMENTS

| | | | | |
|---|---|---|---|---|
| 5,143,867 A | * | 9/1992 | d'Heurle et al. | 437/188 |
| 5,893,752 A | * | 4/1999 | Zhang et al. | 438/687 |
| 5,969,422 A | * | 10/1999 | Ting et al. | 257/762 |
| 6,090,710 A | * | 7/2000 | Andricacos et al. | 438/687 |
| 6,181,012 B1 | * | 1/2001 | Edelstein et al. | 257/762 |
| 6,258,717 B1 | * | 7/2001 | Uzoh et al. | 438/687 |

OTHER PUBLICATIONS

Ryu et al, "Microstructure and reliabilty Copper interconnects", Electron Devices, IEEE transactions on June 1999, vol. 46, Issue 6, pp. 1113–1120.*

* cited by examiner

Primary Examiner—Charles Bowers
Assistant Examiner—Thanhha Pham
(74) Attorney, Agent, or Firm—LaRiviere, Grubman & Payne, LLP (57) ABSTRACT

A method of reducing electromigration in Cu interconnect lines by forming an interim layer of Ca-doped copper seed layer lining a via in a chemical solution and a semi conductor device thereby formed. The method reduces the drift velocity which then decreases the Cu migration rate in addition to void formation rate. The method comprises: depositing a Cu seed layer in the via; treating the Cu seed layer in a chemical solution, selectively forming a Cu—Ca—X conformal layer on the Cu seed layer, wherein X denotes at least one contaminant; and processing the Cu—Ca—X conformal layer, effecting a thin Cu—Ca conformal layer on the Cu seed layer; annealing the thin Cu—Ca conformal layer onto the Cu seed layer, removing the at least one contaminant, thereby forming a contaminant-reduced Cu—Ca alloy surface on the Cu seed layer; electroplating the contaminant-reduced Cu—Ca alloy surface with Cu, thereby forming a contaminant-reduced Cu—Ca/Cu interconnect structure; annealing the at least one contaminant-reduced Cu—Ca/Cu interconnect structure, thereby forming at least one virtually void-less and contaminant-reduced Cu—Ca/Cu interconnect structure; and chemical mechanical polishing the at least one virtually void-less and contaminant-reduced Cu—Ca/Cu interconnect structure.

11 Claims, 6 Drawing Sheets

METHOD OF REDUCING ELECTROMIGRATION IN COPPER LINES BY FORMING AN INTERIM LAYER OF CALCIUM-DOPED COPPER SEED LAYER IN A CHEMICAL SOLUTION AND SEMICONDUCTOR DEVICE THEREBY FORMED

CROSS-REFERENCE TO RELATED APPLICATION(S)

This application is related to concurrently filed and commonly assigned applications (serial numbers to be assigned) entitled:

"Chemical Solution for Cu—Ca—O Thin Film Formations on Cu Surfaces;"

"Method of Forming Cu—Ca—O Thin Films on Cu Surfaces in a Chemical Solution and Semiconductor Device Thereby Formed;"

"Method of Calcium Doping a Cu Surface Using a Chemical Solution and Semiconductor Device Thereby Formed;"

"Method of Reducing Carbon, Sulphur, and Oxygen Impurities in a Calcium-Doped Cu Surface and Semiconductor Device Thereby Formed;" and "Method of Reducing Electromigration in Copper Lines by Calcium-Doping Copper Surfaces in a Chemical Solution and Semiconductor Device Thereby Formed."

TECHNICAL FIELD

The present invention relates to semiconductor devices and their methods of fabrication. More particularly, the present invention relates to the processing of copper interconnect material and the resultant device utilizing the same. Even more particularly, the present invention relates to reducing electromigration in copper interconnect lines by doping their surfaces with barrier material using wet chemical methods.

BACKGROUND OF THE INVENTION

Currently, the semiconductor industry is demanding faster and denser devices (e.g., 0.05-$\mu$m to 0.25-$\mu$m) which implies an ongoing need for low resistance metallization. Such need has sparked research into resistance reduction through the use of barrier metals, stacks, and refractory metals. Despite aluminum's (Al) adequate resistance, other Al properties render it less desirable as a candidate for these higher density devices, especially with respect to its deposition into plug regions having a high aspect ratio cross-sectional area. Thus, research into the use of copper as an interconnect material has been revisited, copper being advantageous as a superior electrical conductor, providing better wettability, providing adequate electromigration resistance, and permitting lower depositional temperatures. The copper (Cu) interconnect material may be deposited by chemical vapor deposition (CVD), plasma enhanced chemical vapor deposition (PECVD), sputtering, electroless plating, and electrolytic plating.

However, some disadvantages of using Cu as an interconnect material include etching problems, corrosion, and diffusion into silicon.[1] These problems have instigated further research into the formulation of barrier materials for preventing electromigration in both Al and Cu interconnect lines. In response to electromigration concerns relating to the fabrication of semiconductor devices particularly having aluminum-copper alloy interconnect lines, the industry has been investigating the use of various barrier materials such as titanium-tungsten (Ti—W) and titanium nitride (TiN) layers as well as refractory metals such as titanum (Ti), tungsten (W), tantalum (Ta), and molybdenum (Mo) and their silicides.[2] Although the foregoing materials are adequate for Al interconnects and Al—Cu alloy interconnects, they have not been entirely effective with respect to all-Cu interconnects. Further, though CVD has been conventionally used for depositing secondary metal(s) on a primary metal interconnect surface, CVD is not a cost-effective method of doping Cu interconnect surfaces with calcium (Ca) ions.

[1] Peter Van Zant, Microchip Fabrication: A Practical Guide to Semiconductor Processing, 3$^{rd}$ Ed., p. 397 (1997).
[2] Id., at 392. Therefore, a need exists for a method of reducing electromigration in Cu interconnect lines by forming an interim protective layer from a chemical solution and a semiconductor device thereby formed.

BRIEF SUMMARY OF THE INVENTION

Accordingly, the present invention provides a method of reducing electromigration in Cu interconnect lines by forming an interim layer of Ca-doped copper seed layer lining a via in a chemical solution and a semiconductor device thereby formed. The present invention method reduces electromigration in Cu interconnect lines by decreasing the drift velocity therein which decreases the Cu migration rate in addition to void formation rate. More specifically, the present invention provides a method of fabricating a semiconductor device having reduced electromigration in its Cu interconnect lines and a device thereby formed, the method comprising: A) providing a semiconductor substrate, the substrate having at least one via formed therein, each at least one via having a volume being optionally lined with a barrier layer; B) depositing a copper (Cu) seed layer in the at least one via for facilitating subsequent formation of at least one Cu interconnect line, the Cu seed layer lining the at least one via, the Cu seed layer comprising at least one intermediate Cu layer selected from a group of intermediate copper layers consisting essentially of: (1) a blanket Cu seed layer, and (2) a partial thickness Cu plated layer; C) treating the Cu seed layer in a chemical solution, thereby selectively forming a copper-calcium-X (Cu—Ca—X) conformal layer on the Cu seed layer, wherein X denotes at least one contaminant, and D) processing the Cu—Ca—X conformal layer by a technique selected from a group of techniques consisting essentially of: (1) proceeding to step E, (2) sputtering under an argon (Ar) atmosphere, and (3) treating in a plasma ambient, thereby effecting a thin Cu—Ca conformal layer on the Cu seed layer; E) annealing the thin Cu—Ca conformal layer onto the Cu seed layer, thereby removing the at least one contaminant, whereby the thin Cu—Ca conformal layer is alloyed, and thereby forming a contaminant-reduced Cu—Ca alloy surface on the Cu seed layer; F) electroplating the Cu—Ca alloy surface with Cu for filling the volume of the at least one via 11, thereby forming the at least one Cu interconnect line, and thereby forming at least one contaminant-reduced Cu—Ca/Cu interconnect structure, comprising the a contaminant-reduced Cu—Ca alloy surface on the Cu seed layer, in the via; G) annealing the at least one contaminant-reduced Cu—Ca/Cu interconnect structure, thereby forming at least one virtually void-less and contaminant-reduced Cu—Ca/Cu interconnect structure; H) chemical mechanical polishing the at least one virtually void-less and contaminant-reduced Cu—Ca/Cu interconnect structure and the optional barrier layer for forming a planarized surface; and I ) completing formation of the semiconductor device. The annealing step primarily removes O and secondarily removes C and S, especially when performed in an environment such as a vacuum, an inert gas, and a reducing ambient such as an ammonia ($NH_3$) plasma. Further, the present invention improves Cu interconnect reliability by enhancing electromigration resistance through impurity-level control, thereby balancing electromigration performance against low resistivity requirements.

DESCRIPTION OF THE DRAWINGS

For a better understanding of the present invention, reference is made to the below-referenced accompanying drawings.

FIG. 4 is a cross-sectional view of a semiconductor substrate having formed therein a via with an optional barrier layer; the optional barrier layer having deposited a blanket Cu seed layer, as shown in FIG. 1; the blanket Cu seed layer having selectively formed thereon a Cu—Ca—X conformal layer by treating the blanket Cu seed layer in a chemical solution; the Cu—Ca—X conformal layer being optionally treated by a process such as Ar sputtering, as shown in FIG. 2, the Cu—Ca—X conformal layer being annealed onto the blanket Cu seed layer, thereby forming a contaminant-reduced Cu—Ca alloy surface on the blanket Cu seed layer, as shown in FIG. 3, the contaminant-reduced Cu—Ca alloy surface having been further electroplated with Cu for filling the via, thereby forming a Cu interconnect line; and the Cu interconnect line also being annealed, in accordance with the present invention.

FIG. 5 is a cross-sectional view of a semiconductor substrate having formed therein a via with an optional barrier layer; the optional barrier layer having deposited a blanket Cu seed layer, as shown in FIG. 1; the blanket Cu seed layer having selectively formed thereon a Cu—Ca—X conformal layer by treating the blanket Cu seed layer in a chemical solution; the Cu—Ca—X conformal layer being optionally treated by a process such as Ar sputtering, as shown in FIG. 2, the Cu—Ca—X conformal layer being annealed onto the blanket Cu seed layer, thereby forming a contaminant-reduced Cu—Ca alloy surface on the blanket Cu seed layer, as shown in FIG. 3, the contaminant-reduced Cu—Ca alloy surface having been further electroplated with Cu for filling the via, thereby forming a contaminant-reduced Cu—Ca/Cu interconnect structure, comprising the contaminant-reduced Cu—Ca alloy surface, the contaminant-reduced Cu—Ca/Cu interconnect structure also being annealed, as shown in FIG. 4, further chemical mechanical polishing the Cu interconnect line, the Cu—Ca alloy surface, the blanket Cu seed layer, and the optional barrier layer for forming a planarized surface, thereby forming a virtually void-less and contaminant-reduced Cu—Ca/Cu interconnect structure in accordance with the present invention.

FIG. 7 is a cross-sectional view of a semiconductor substrate having formed therein a via having an optional barrier layer, the optional barrier layer having deposited a blanket Cu seed layer, as shown in FIG. 1, the blanket Cu seed layer being partially electroplated with Cu, thereby forming a partial thickness Cu plated layer, as shown in FIG. 6, the partial thickness Cu plated layer having selectively formed thereon a Cu—Ca—X conformal layer by treating the partial thickness Cu plated layer in a chemical solution, thereby forming a Cu—Ca conformal layer; the Cu—Ca conformal layer being optionally treated by a process such as Ar sputtering; the Cu—Ca—X conformal layer being annealed onto the partial thickness Cu plated layer, thereby decreasing its thickness to form a thin Cu—Ca conformal layer, and thereby forming a contaminant-reduced Cu—Ca alloy surface on the partial thickness Cu plated layer, in accordance with the present invention.

FIG. 8 is a cross-sectional view of a semiconductor substrate having formed therein a via having an optional barrier layer, the optional barrier layer having deposited a blanket Cu seed layer, as shown in FIG. 1, the blanket Cu seed layer being partially electroplated with Cu, thereby forming a partial thickness Cu plated layer, as shown in FIG. 6, the partial thickness Cu plated layer having selectively formed thereon a Cu—Ca—X conformal layer by treating the partial thickness Cu plated layer in a chemical solution, thereby forming a Cu—Ca conformal layer; the Cu—Ca conformal layer being optionally treated by a process such as Ar sputtering; the Cu—Ca—X conformal layer being annealed onto the partial thickness Cu plated layer, thereby decreasing its thickness to form a thin Cu—Ca conformal layer, and thereby forming a Cu—Ca alloy surface on the partial thickness Cu plated layer, as shown in FIG. 7, the Cu—Ca alloy surface having been further electroplated with Cu for filling the via, and thereby forming a Cu interconnect line, the Cu interconnect line also being annealed; further chemical mechanical polishing the Cu interconnect line, the Cu—Ca alloy surface, the partial thickness Cu plated layer, the blanket Cu seed layer, and the optional barrier layer for forming a planarized surface, in accordance with the present invention.

Reference numbers refer to the same or equivalent parts of the present invention throughout the several figures of the drawings.

DETAILED DESCRIPTION OF THE INVENTION

Figure 1:
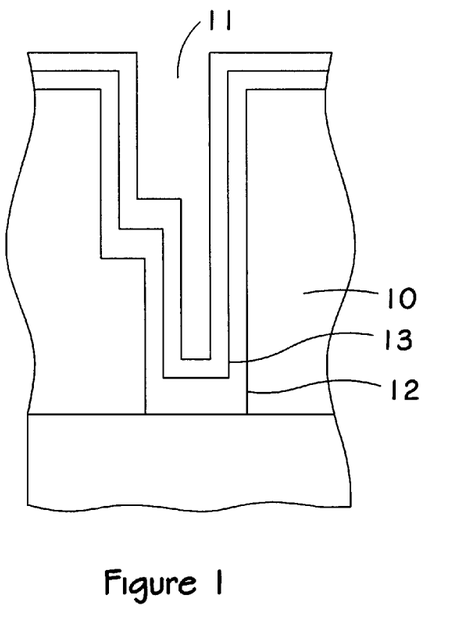
FIG. 1 is a cross-sectional view of a semiconductor substrate having formed therein a via, optionally lined with a barrier layer, the optional barrier layer having deposited a blanket Cu seed layer, for subsequent formation of a Cu interconnect line, in accordance with the present invention.

FIG. 1 is a cross-sectional view of a semiconductor substrate 10 having formed therein a via 11, optionally lined with a barrier layer 12 such as Ta, the optional barrier layer 12 having deposited a blanket Cu seed layer 13, for subsequent formation of a Cu interconnect line, in accordance with the present invention.

Figure 2:
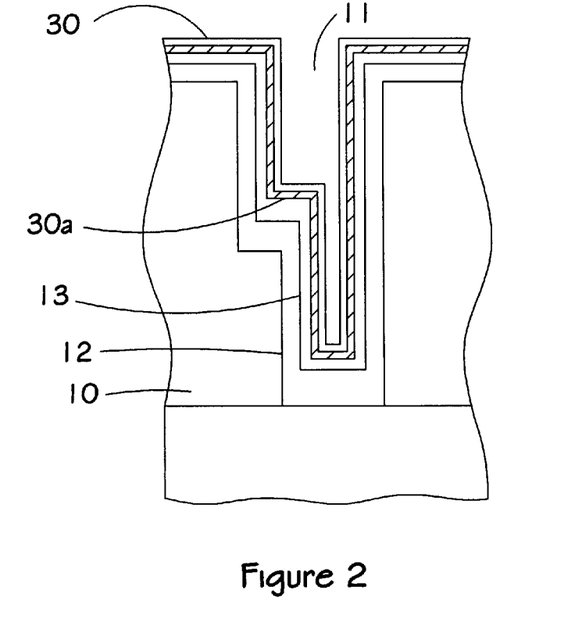
FIG. 2 is a cross-sectional view of a semiconductor substrate having formed therein a via with an optional barrier layer; the optional barrier layer having deposited a blanket Cu seed layer, as shown in FIG. 1; the blanket Cu seed layer having selectively formed thereon a Cu—Ca—X conformal layer by treating the blanket Cu seed layer in a chemical solution; the Cu—Ca—X conformal layer being optionally treated by a process such as Ar sputtering, in accordance with the present invention.

FIG. 2 is a cross-sectional view of a semiconductor substrate 10 having formed therein a via 11, optionally lined with a barrier layer 12, the optional barrier layer 12 having deposited a blanket Cu seed layer 13, for subsequent formation of a Cu interconnect line, as shown in FIG. 1, the blanket Cu seed layer 13 having selectively formed thereon a Cu—Ca—X conformal layer 30 by treating the blanket Cu seed layer 13 in a chemical solution, where contaminant X=C, S, or O; the Cu—Ca—X conformal layer 30 being optionally treated by a process such as Ar sputtering, thereby contributing to decreasing its thickness to form a thin Cu—Ca conformal layer 30a, in accordance with the present invention.

Figure 3:
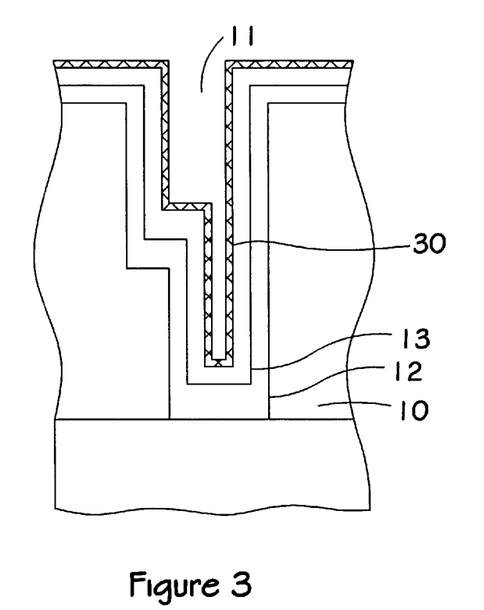
FIG. 3 is a cross-sectional view of a semiconductor substrate having formed therein a via with an optional barrier layer; the optional barrier layer having deposited a blanket Cu seed layer, as shown in FIG. 1; the blanket Cu seed layer having selectively formed thereon a Cu—Ca—X conformal layer by treating the blanket Cu seed layer in a chemical solution; the Cu—Ca—X conformal layer being optionally treated by a process such as Ar sputtering, as shown in FIG. 2, the Cu—Ca—X conformal layer being annealed onto the blanket Cu seed layer, thereby forming a contaminant-reduced Cu—Ca alloy surface on the blanket Cu seed layer, in accordance with the present invention.

FIG. 3 is a cross-sectional view of a semiconductor substrate 10 having formed therein a via 11, optionally lined with a barrier layer 12, the optional barrier layer 12 having deposited a blanket Cu seed layer 13, for subsequent formation of a Cu interconnect line, as shown in FIG. 1, the blanket Cu seed layer 13 having selectively formed thereon a Cu—Ca—X conformal layer 30 by treating the blanket Cu seed layer 13 in a chemical solution; the Cu—Ca conformal layer 30 being optionally treated by a process such as Ar sputtering, thereby contributing to decreasing its thickness to form a thin Cu—Ca conformal layer 30a, as shown in FIG. 2, the Cu—Ca—X conformal layer 30 being annealed onto the blanket Cu seed layer 13, thereby decreasing its thickness to form the thin Cu—Ca conformal layer 30a, the thin Cu—Ca conformal layer 30 a being alloyed, and thereby forming a Cu—Ca alloy surface 30b on the blanket Cu seed layer 13, in accordance with the present invention.

Figure 4:
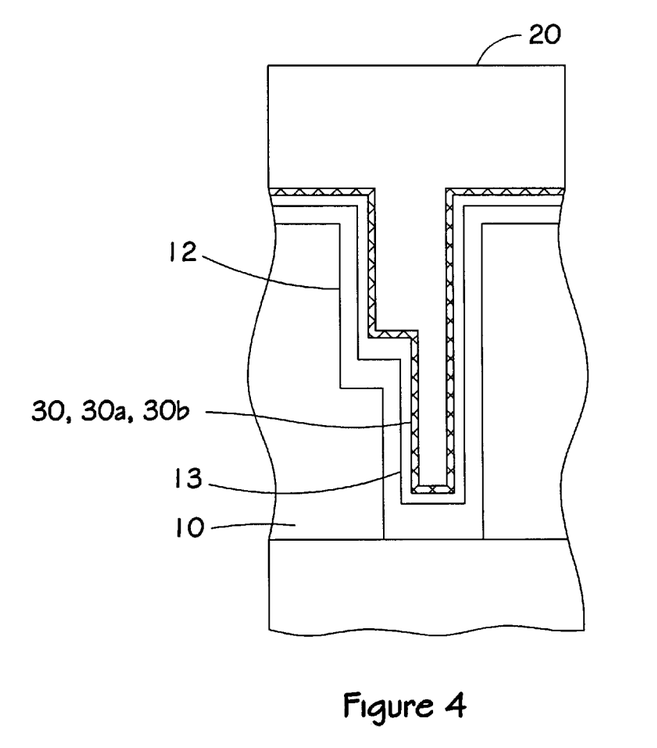

FIG. 4 is a cross-sectional view of a semiconductor substrate 10 having formed therein a via, optionally lined with a barrier layer 12, the optional barrier layer 12 having deposited a blanket Cu seed layer 13, for subsequent formation of a Cu interconnect line 20, as shown in FIG. 1; the blanket Cu seed layer 13 having selectively formed thereon a Cu—Ca—X conformal layer 30 by treating the blanket Cu seed layer 13 in a chemical solution; the Cu—Ca—X conformal layer 30 being optionally treated by a process such as Ar sputtering, thereby contributing to decreasing its thickness to form a thin Cu—Ca conformal layer 30a, as shown in FIG. 2; the Cu—Ca—X conformal layer 30 being annealed onto the blanket Cu seed layer 13, thereby decreasing its thickness to form the thin Cu—Ca conformal layer 30a; the thin Cu—Ca conformal layer 30a being alloyed, and thereby forming a Cu—Ca alloy surface 30b on the blanket Cu seed layer 13, as shown in FIG. 3; the Cu—Ca alloy surface 30b having been further electroplated with Cu for filling the via 11, and thereby forming a Cu interconnect line 20; and the Cu interconnect line 20 also being annealed, in accordance with the present invention.

Figure 5:
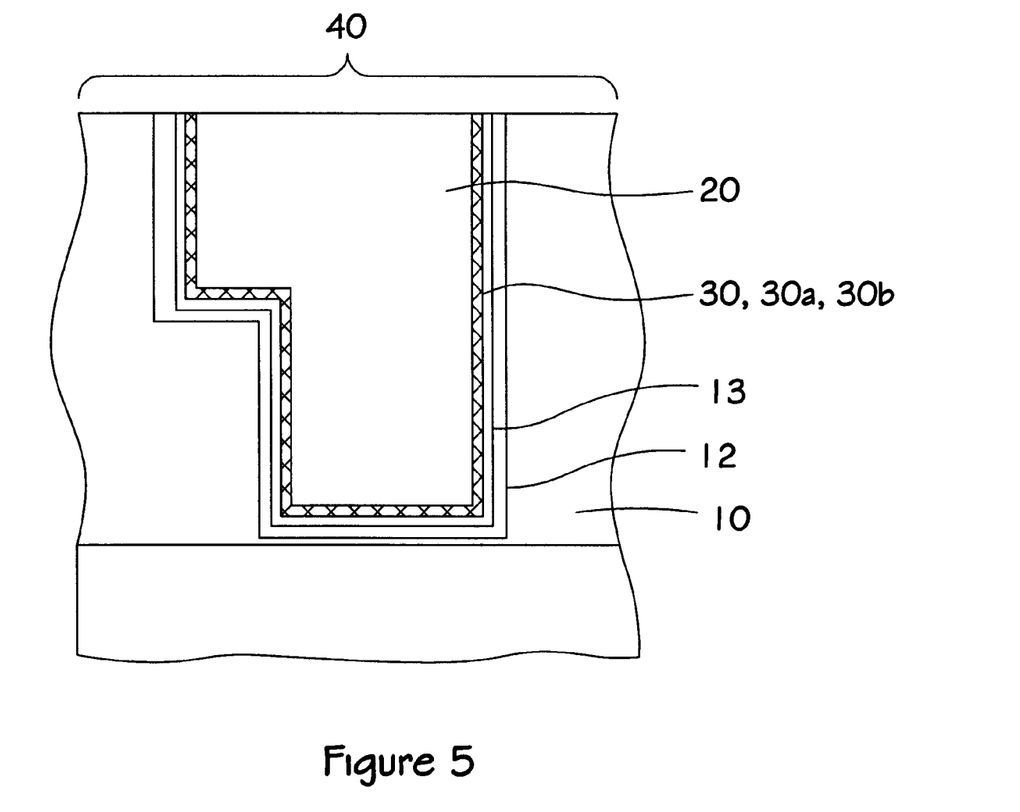

FIG. 5 is a cross-sectional view of a semiconductor substrate 10 having formed therein a via 11, optionally lined with a barrier layer 12, the optional barrier layer 12 having deposited a blanket Cu seed layer 13, for subsequent formation of a Cu interconnect line 20, as shown in FIG. 1; the blanket Cu seed layer 13 having selectively formed thereon a Cu—Ca—X conformal layer 30 by treating the blanket Cu seed layer 13 in a chemical solution; the Cu—Ca—X conformal layer 30 being optionally treated by a process such as Ar sputtering, thereby contributing to decreasing its thickness to form a thin Cu—Ca conformal layer 30a, as shown in FIG. 2; the Cu—Ca—X conformal layer 30 being annealed onto the blanket Cu seed layer 13, thereby decreasing its thickness to form the thin Cu—Ca conformal layer 30a; the thin Cu—Ca conformal layer 30a being alloyed, and thereby forming a Cu—Ca alloy surface 30b on the blanket Cu seed layer 13, as shown in FIG. 3; the Cu—Ca alloy surface 30b having been further electroplated with Cu for filling the via 11, and thereby forming a Cu interconnect line 20; the Cu interconnect line 20 also being annealed, thereby forming a composite interconnect structure comprising the Cu interconnect line 20, the Cu—Ca alloy surface 30b, and the blanket Cu seed layer 13, as shown in FIG. 4; and further chemical-mechanical-polishing (CMP) the Cu interconnect line 20, the Cu—Ca alloy surface 30b, the blanket Cu seed layer 13, and the optional barrier layer 12 for forming a planarized surface 40, in accordance with the present invention.

Figure 6:
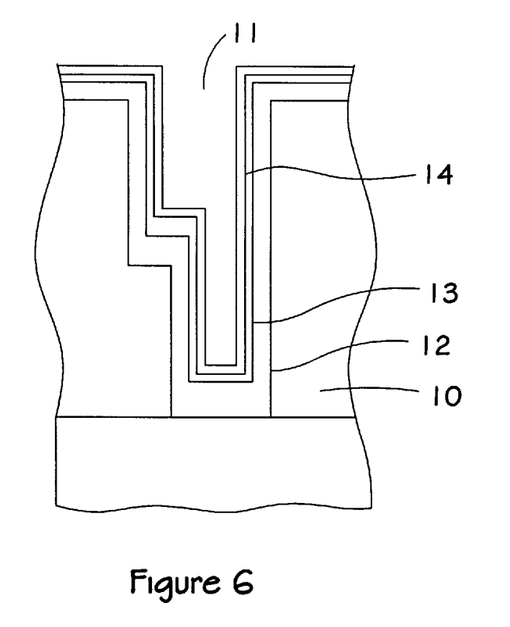
FIG. 6 is a cross-sectional view of a semiconductor substrate having formed therein a via having an optional barrier layer, the optional barrier layer having deposited a blanket Cu seed layer, as shown in FIG. 1, the blanket Cu seed layer being partially electroplated with Cu, thereby forming a partial thickness Cu plated layer, in accordance with the present invention.

FIG. 6 is a cross-sectional view of a semiconductor substrate 10 having formed therein a via 11, optionally lined with a barrier layer 12; the optional barrier layer 12 having deposited a blanket Cu seed layer 13, for subsequent formation of a Cu interconnect line 20, as shown in FIG. 1; the blanket Cu seed layer 13 being partially electroplated with Cu, thereby forming a partial thickness Cu plated layer 14, in accordance with the present invention.

Figure 7:
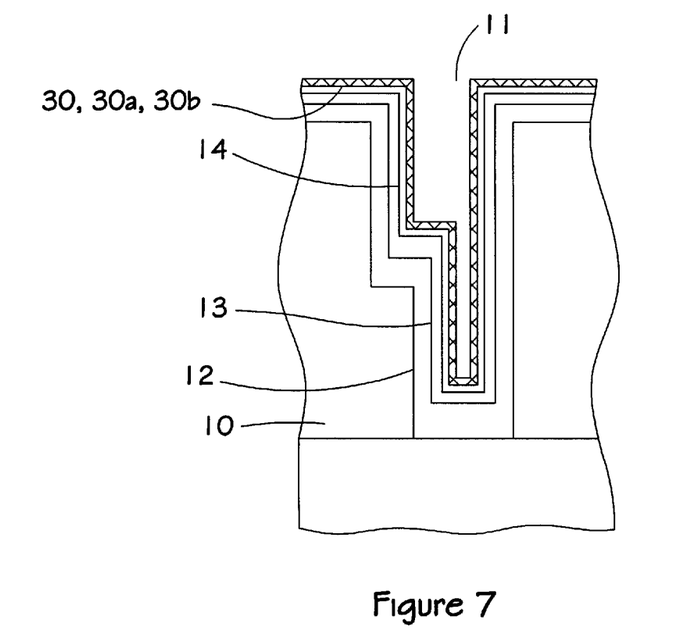

FIG. 7 is a cross-sectional view of a semiconductor substrate 10 having formed therein a via 11, optionally lined with a barrier layer 12; the optional barrier layer 12 having deposited a blanket Cu seed layer 13, for subsequent formation of a Cu interconnect line 20; the blanket Cu seed layer 13 being partially electroplated with Cu, thereby forming a partial thickness Cu plated layer 14, as shown in FIG. 6; the partial thickness Cu plated layer 14 having selectively formed thereon a Cu—Ca—X conformal layer 30 by treating the partial thickness Cu plated layer 14 in a chemical solution; the Cu—Ca conformal layer 30 being optionally treated by a process such as Ar sputtering, thereby contributing to decreasing its thickness to form a thin Cu—Ca conformal layer 30a; the Cu—Ca—X conformal layer 30 being annealed onto the partial thickness Cu plated layer 14, thereby decreasing its thickness to form the thin Cu—Ca conformal layer 30a; the thin Cu—Ca conformal layer 30a being alloyed, and thereby forming a Cu—Ca alloy surface 30b on the partial thickness Cu layer plated 14, in accordance with the present invention.

Figure 8:
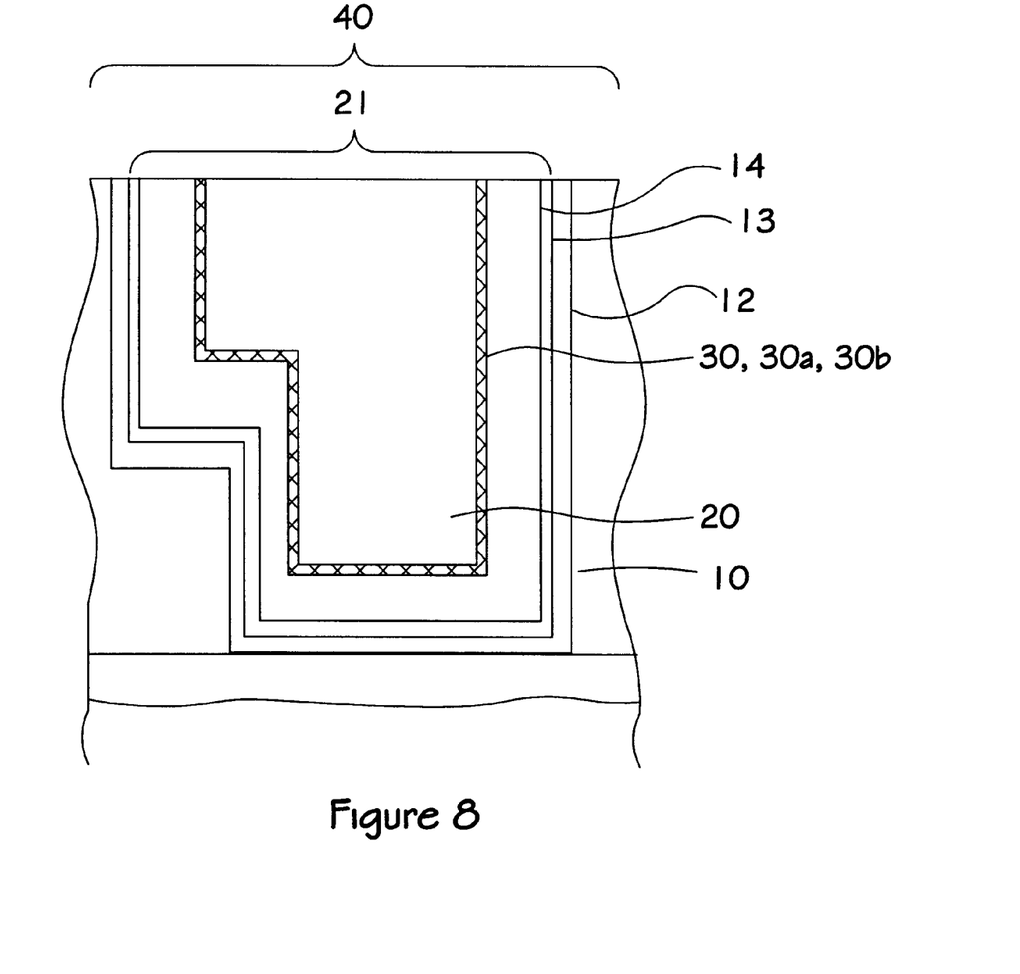

FIG. 8 is a cross-sectional view of a semiconductor substrate 10 having formed therein a via, optionally lined with a barrier layer 12; the optional barrier layer 12 having deposited a blanket Cu seed layer 13 for subsequent formation of a Cu interconnect line 20; the blanket Cu seed layer 13 being partially electroplated with Cu, thereby forming a partial thickness Cu plated layer 14, as shown in FIG. 6; the partial thickness plated Cu layer 14 having selectively formed thereon a Cu—Ca—X conformal layer 30 by treating the partial thickness plated Cu layer 14 in a chemical solution; the Cu—Ca conformal layer 30 being optionally treated by a process such as Ar sputtering, thereby contributing to decreasing its thickness to form a thin Cu—Ca conformal layer 30a; the Cu—Ca—X conformal layer 30 being annealed onto the partial thickness Cu plated layer 14, thereby forming the thin Cu—Ca conformal layer 30a, the thin Cu—Ca conformal layer 30a being alloyed, and thereby forming a contaminant-reduced Cu—Ca alloy surface 30b on the partial thickness Cu plated layer 14, as shown in FIG. 7; the contaminant-reduced Cu—Ca alloy surface 30b having been further electroplated with Cu for filling the via, and thereby forming the Cu interconnect line 20, the Cu interconnect line 20 also being annealed, thereby forming a virtually void-less contaminant-reduced Cu—Ca/Cu interconnect structure 21, the virtually void-less contaminant-reduced Cu—Ca/Cu interconnect structure 21 comprising a composite structure, the composite structure comprising the Cu interconnect line 20, the Cu—Ca alloy surface 30b, the blanket Cu seed layer 13, the partial thickness plated Cu layer 14; and further chemical-mechanical-polishing (CMP) the virtually void-less contaminant-reduced Cu—Ca/Cu interconnect structure 21 and the optional barrier layer 12 for forming a planarized surface 40, in accordance with the present invention.

Figure 9:
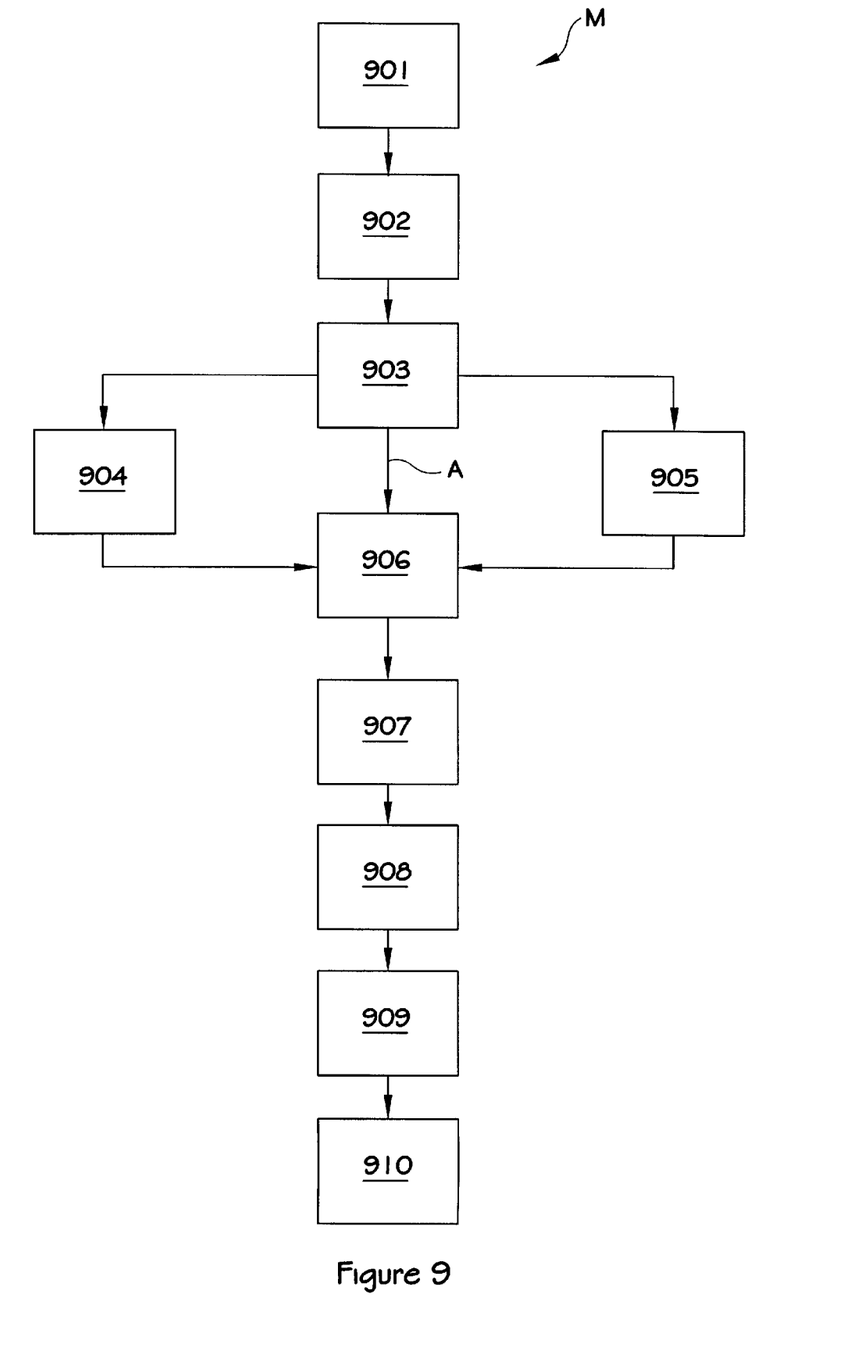
FIG. 9 is a flowchart of a method for fabricating a semiconductor device having a virtually void-less contaminant-reduced Ca—Cu/Cu interconnect line structure for reducing electromigration therein, in accordance with the present invention.

FIG. 9 is flowchart of a method M for fabricating a semiconductor device, having a virtually void-less and contaminant-reduced Cu—Ca/Cu interconnect line structure 21 for reducing electromigration therein, comprising: A) providing a semiconductor substrate 10, the substrate 10 having at least one via 11 formed therein, each at least one via 11 having a volume being optionally and partially lined with a barrier layer 12, as indicated by block 901; B) depositing a copper (Cu) seed layer in the at least one via for facilitating subsequent formation of at least one Cu interconnect line 20, the Cu seed layer lining the at least one via 11, the Cu seed layer comprising at least one intermediate Cu layer selected from a group of intermediate copper layers consisting essentially of: (1) a blanket Cu seed layer 13, and (2) a partial thickness Cu plated layer 14, as indicated by block 902; C) treating the Cu seed layer in a chemical solution, thereby selectively forming a copper-calcium-X (Cu—Ca—X) conformal layer 30 on the Cu seed layer, wherein X denotes at least one contaminant, as indicated by block 903; and D) processing the Cu—Ca—X conformal layer 30 by a technique selected from a group of techniques consisting essentially of (1) proceeding to step E, as indicated by arrow A and block 906, (2) sputtering under an Ar atmosphere, as indicated by block 904, and (3) treating in a plasma ambient, thereby removing the at least one contaminant, as indicated by block 905, contributing to forming a thin Cu—Ca conformal layer 30a on the Cu seed layer; E) annealing the thin Cu—Ca conformal layer 30a onto the Cu seed layer, thereby forming the thin Cu—Ca conformal layer 30a, whereby the thin Cu—Ca conformal layer is alloyed, and thereby forming a contaminant-reduced Cu—Ca alloy surface 30b on the Cu seed layer, as indicated by block 906; F) electroplating the contaminant-reduced Cu—Ca alloy surface 30b with Cu for filling the volume of the at least one via 11, thereby forming the at least one Cu interconnect line 20, and thereby forming, at least one contaminant-reduced Cu—Ca/Cu interconnect structure, comprising the contaminant-reduced Cu—Ca alloy surface 30b, in the via, as indicated by block 907; G) annealing the at least one virtually contaminant-reduced Cu—Ca/Cu interconnect structure, thereby forming at least one virtually void-less and contaminant-reduced Cu—Ca/Cu interconnect structure 21, as indicated by block 908; H) chemical mechanical polishing the at least one virtually void-less and contaminant-reduced Cu—Ca/Cu interconnect structure 21 and the optional barrier layer 12 for forming a planarized surface 40, as indicated by block 909; and I ) completing formation of the semiconductor device, as indicated by block 910, in accordance with the present invention.

The method M and devices thereby formed may also comprise additional features wherein the optional barrier layer 12 comprises tantalum (Ta); wherein the blanket Cu seed layer 13 is deposited by a technique selected from a group of techniques consisting essentially of electroplating, electroless plating, chemical vapor deposition (CVD), plasma vapor deposition (PVD), plasma enhanced chemical vapor deposition (PECVD), and atomic layer deposition (ALD); wherein the partial thickness Cu plated layer 14 is deposited by a technique comprising electroplating; wherein the Cu interconnect line 20 is dual inlaid; wherein the chemical solution comprises an electroless plating solution; wherein the electroless plating solution comprises at least one Cu salt, at least one Ca salt, at least one complexing agent, at least one reducing agent, at least one pH adjuster, and at least one surfactant; wherein the at least one contaminant is selected from a group of contaminants consisting essentially of carbon (C), sulphur (S), and oxygen (0); wherein the annealing step (E) is performed in a temperature range of 250° C. to 450° C. and under vacuum; and wherein the Cu—Ca alloy surface is Cu-rich with a Ca-doping level in a concentration range of 0.2 atomic % to 5 atomic %. The annealing step primarily removes O and secondarily removes C and S, especially when performed in an environment such as a vacuum, an inert gas, and a reducing ambient such as an ammonia ($NH_3$) plasma.

Alternatively, a device having a greater tolerance of impurities may also be formed (e.g., more impurity-tolerant applications): (1) where high levels of C and S impurities are tolerable in the Cu—Ca—X film, neither the Ar-sputtering step nor the annealing step need be performed; (2) where low levels of C and S impurities are tolerable in the Cu—Ca—X film, the annealing step need be performed; (3) where high levels of C, S, and O impurities are tolerable in the Cu—Ca film, the Ar-sputtering step need not be performed; however, (4) where low to zero levels of C, S, and O impurities are tolerable in the Cu—Ca film, the full process (i.e., method M) must be performed.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims. Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S. C. 112, sixth paragraph, unless the element is expressly recited using the phrase "means for."

What is claimed:

1. A method of fabricating a semiconductor device having a virtually voidless and contaminant-reduced copper-calcium alloy surface on copper (Cu—Ca/Cu) interconnect structure for reducing electromigration therein, comprising:
   A. providing a semiconductor substrate, the substrate having at least one via formed therein;
   B. depositing a copper (Cu) seed layer in the at least one via for facilitating subsequent formation of at least one Cu interconnect line, the Cu seed layer lining the at least one via, the Cu seed layer comprising at least one intermediate Cu layer selected from a group of intermediate copper layers consisting essentially of:
      (1) a blanket Cu seed layer, and
      (2) a partial thickness Cu plated layer;
   C. treating the Cu seed layer in a chemical solution, thereby selectively forming a copper-calcium-X (Cu—Ca—X) conformal layer on the Cu seed layer, wherein X denotes at least one contaminant;
   D. processing the Cu—Ca—X conformal layer by a technique selected from a group of techniques consisting essentially of:
      (1) proceeding to step (E),
      (2) sputtering under an argon (Ar) atmosphere, and
      (3) treating in a plasma ambient;
   E. annealing the Cu—Ca—X conformal layer,
      thereby removing the at least one contaminant,
      thereby decreasing thickness of the Cu—Ca—X conformal layer,
      thereby forming a thin Cu—Ca conformal layer on the Cu seed layer,
      whereby the thin Cu—Ca conformal layer is alloyed, and
      thereby forming a contaminant-reduced Cu—Ca alloy surface on the Cu seed layer;
   F. electroplating the contaminant-reduced Cu—Ca alloy surface with Cu for filling the volume of the at least one via,
      thereby forming the at least one Cu interconnect line, and
      thereby forming at least one contaminant-reduced Cu—Ca/Cu interconnect structure in the via;
   G. annealing the at least one containment-reduced Cu—Ca/Cu interconnect structure,
      thereby forming at least one virtually voidless and contaminant-reduced Cu—Ca/Cu interconnect structure;
   H. chemical-mechanical-polishing the at least one virtually voidless and contaminant-reduced Cu—Ca/Cu interconnect structure for forming a planarized surface; and
   I. completing formation of the semiconductor device.

2. A method, as recited in claim 1,
   wherein the chemical solution comprises an electroless plating solution, and
   wherein the electroless plating solution comprises:
      a. at least one solvent,
      b. at least one Cu salt;
      C. at least one Ca salt;
      d. at least one complexing agent; and
      e. at least one reducing agent, (b) through (e) being dissolved in (a).

3. A method, as recited in claim 2, wherein the electroless plating solution further comprises:
   f. at least one pH adjuster; and
   g. at least one surfactant, (f) and (g) being dissolved in (a).

4. A method, as recited in claim 1, wherein the at least one contaminant is selected from a group of contaminants consisting essentially of carbon (C), sulphur (S), and oxygen (O).

5. A method, as recited in claim 1, wherein the annealing step (E) is performed in a temperature range of 250° C. to 450° C. and in an environment selected from a group of environments consisting essentially of a vacuum, an inert gas, and a reducing ambient.

6. A method, as recited in claim 1, wherein the Cu—Ca alloy surface is Cu-rich with a Ca-doping level in a concentration range of 0.2 atomic % to 5 atomic %.

7. A method, as recited in claim 2, wherein the Cu—Ca alloy surface is Cu-rich with a Ca-doping level in a concentration range of 0.2 atomic % to 5 atomic %.

8. A method, as recited in claim 3, wherein the Cu—Ca alloy surface is Cu-rich with a Ca-doping level in a concentration range of 0.2 atomic % to 5 atomic %.

9. A method, as recited in claim 1, further comprising a barrier layer formed in each at least one via.

10. A method, as recited in claim 9,
    wherein the barrier layer comprises tantalum (Ta),
    wherein the blanket Cu seed layer is deposited by a technique selected from a group of techniques consisting essentially of electroplating, electroless plating, chemical vapor deposition (CVD), plasma vapor deposition (PVD), plasma enhanced chemical vapor deposition (PECVD), and atomic layer deposition (ALD),
    wherein the partial thickness Cu plated layer is deposited by a technique comprising electroplating, and
    wherein the Cu interconnect line is dual inlaid.

11. A method of fabricating a semiconductor device having a virtually void-less and contaminant-reduced copper-calcium alloy surface on copper (Cu—Ca/Cu) interconnect structure for reducing electromigration therein, as recited in claim 9,
    wherein the barrier layer comprises tantalum (Ta),
    wherein the blanket Cu seed layer is deposited by a technique selected from a group of techniques consisting essentially of electroplating, electroless plating, chemical vapor deposition (CVD), plasma vapor deposition (PVD), plasma enhanced chemical vapor deposition (PECVD), and atomic layer deposition (ALD),
    wherein the partial thickness Cu plated layer is deposited by a technique comprising electroplating, and
    wherein the Cu interconnect line is dual inlaid,
    wherein the chemical solution comprises an electroless plating solution,
    wherein the electroless plating solution comprises:
        a. at least one solvent;
        b. at least one Cu salt,
        C. at least one Ca salt,
        d. at least one complexing agent,
        e. at least one reducing agent,
        f. at least one pH adjuster, and
        g. at least one surfactant, (b) through (g) being dissolved in (a),
    wherein the at least one contaminant is selected from a group of contaminants consisting essentially of carbon (C), sulphur (S), and oxygen (O),
    wherein the annealing step (E) is performed in a temperature range of 250° C. to 450° C. in an environment selected from a group of environments consisting essentially of a vacuum, an inert gas, and a reducing ambient, and
    wherein the contaminant-reduced Cu—Ca alloy surface is Cu-rich with a Ca-doping level in a concentration range of 0.2 atomic % to 5 atomic %.

* * * * *

UNITED STATES PATENT AND TRADEMARK OFFICE
CERTIFICATE OF CORRECTION

PATENT NO. : 6,358,848 B1
DATED : March 19, 2002
INVENTOR(S) : Sergey Lopatin

It is certified that error appears in the above-identified patent and that said Letters Patent is hereby corrected as shown below:

Title page,
Item [57], ABSTRACT,
Lines 3-4, delete "semi conductor" and replace with -- semiconductor --

Column 2,
Line 12, after the word "ions" add -- Therefore, a need exists for a method of reducing electromigration in Cu interconnect lines by forming an interim protective layer from a chemical solution and a semiconductor device thereby formed. --
Lines 15-17, delete "Therefore, a need exists for a method of reducing electromigration in Cu interconnect lines by forming an interim protective layer from a chemical solution and a semiconductor device thereby formed."

Column 5,
Line 37, delete "30 a" and replace with -- 30a --

Column 8,
Line 16, delete "(0)" and replace with -- (O) --

Signed and Sealed this

Tenth Day of December, 2002

JAMES E. ROGAN
*Director of the United States Patent and Trademark Office*